(12) United States Patent
Friedmann et al.

(10) Patent No.: US 7,250,372 B2
(45) Date of Patent: Jul. 31, 2007

(54) METHOD FOR BARC OVER-ETCH TIME ADJUST WITH REAL-TIME PROCESS FEEDBACK

(75) Inventors: James B. Friedmann, Dallas, TX (US); Christopher C. Baum, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 11/177,145

(22) Filed: Jul. 7, 2005

(65) Prior Publication Data
US 2005/0245088 A1    Nov. 3, 2005

Related U.S. Application Data

(62) Division of application No. 10/460,584, filed on Jun. 11, 2003, now Pat. No. 6,979,648, which is a division of application No. 08/913,210, filed on Oct. 22, 1997, now Pat. No. 6,473,438.

(51) Int. Cl.
*H01L 21/302* (2006.01)
(52) U.S. Cl. ............... 438/706; 438/689; 438/725; 430/299; 716/21
(58) Field of Classification Search .............. 438/706
See application file for complete search history.

(56) References Cited

U.S. PATENT DOCUMENTS

| 5,846,878 | A | | 12/1998 | Horiba | |
|---|---|---|---|---|---|
| 5,926,690 | A | * | 7/1999 | Toprac et al. | ............... 438/17 |
| 5,962,195 | A | | 10/1999 | Yen et al. | |
| 6,010,829 | A | * | 1/2000 | Rogers et al. | ............ 430/316 |
| 6,350,390 | B1 | | 2/2002 | Liu et al. | |
| 6,606,738 | B1 | * | 8/2003 | Bell et al. | ................. 716/21 |
| 6,708,073 | B1 | * | 3/2004 | Heavlin | ................. 700/121 |
| 2004/0074869 | A1 | | 4/2004 | Wang et al. | |

* cited by examiner

*Primary Examiner*—Nadine Norton
*Assistant Examiner*—Patricia A. George
(74) *Attorney, Agent, or Firm*—Peter K. McLarty; W. James Brady, III; Frederick J. Telecky, Jr.

(57) ABSTRACT

A method for determining the anti-reflective coating (or bottom anti-reflective coating) over-etch time adjust with real-time process feedback is presented. The critical dimension $CD_{resist}$ of the patterned photoresist is measured and a first wafer with median values chosen (101) from a lot. A first time t* is found (102) and used to form the desired structure. Using the measured critical dimension of the formed structure on the first wafer a second time $t_{lot}$ is found (104). Finally, an over-etch time t(x) is found and used to etch the remaining wafers in the lot (106).

9 Claims, 5 Drawing Sheets

METHOD FOR BARC OVER-ETCH TIME ADJUST WITH REAL-TIME PROCESS FEEDBACK

CROSS-REFERENCE TO RELATED APPLICATIONS

This application is a Division of U.S. Ser. No. 10/460,584 filed on Jun. 11, 2003 now U.S. Pat. No. 6,979,648 which is a Divison of U.S. Ser. No. 08/913,210 filed on Oct. 22, 1997 now U.S. Pat. No. 6,473,438.

FIELD OF THE INVENTION

This invention relates generally to the field of electronic devices and more particularly to a method for adjusting the BARC over-etch time with real-time process feedback during integrated circuit manufacture.

BACKGROUND OF THE INVENTION

Photolithography is used in the manufacture of integrated circuits to form the very small structures required by such circuits. A typical photolithographic process involves the patterning of a photosensitive layer called photoresist to form a patterned mask. The patterned mask is then used to define the underlying layers. In integrated circuits that comprise metal oxide semiconductor (MOS) transistors the most critical dimension is often the length of the MOS transistor gate structure. The length of the MOS transistor gate greatly affects the performance of the transistor and, as such, the length must be very tightly controlled during manufacture.

In forming a MOS transistor gate structure, a blanket layer of the material that will be used to form the transistor gate is first formed on the MOS transistor gate dielectric. Given the constraints of current lithographic processes a bottom anti-reflective layer (BARC) is formed on the blanket layer before the formation of the photoresist that will be used to pattern the MOS transistor gate. Following the patterning of the photoresist layer which is formed on the BARC layer, the BARC layer is patterned by etching the BARC layer using the overlying patterned photoresist layer as an etch mask. Following the patterning of the BARC layer and before the etching of the blanket layer of the transistor gate layer, the BARC dimensions are adjusted by performing an over-etch of the BARC layer. Such an over-etch process will change the dimensions of the patterns in the BARC layer allowing the formation of MOS transistor gate structures with the desired dimensions. The determination of the required BARC over-etch time is critical to obtaining tightly controlled MOS transistor gate lengths. Integrated circuits are usually formed in batches of wafers called lots. A typical lot size comprises about 25 wafers. Current methods of determining the BARC over-etch time often results in wide fluctuations in MOS transistor gate lengths from wafer to wafer within a lot. There is therefore a great need for a method to determine the required BARC over-etch times that reduce the fluctuations in MOS transistor gate length for all wafers within a lot. The instant invention addresses this need.

SUMMARY OF THE INVENTION

A method for adjusting anti-reflective coating (or bottom anti-reflective coating) over-etching time using real time process feedback and normalization to achieve a critical dimension $CD_{final}$ is presented. In an embodiment of the instant invention, the method comprises first providing a plurality of semiconductor wafers with each of the plurality of wafers comprising: a first layer over a semiconductor, a bottom anti-reflective coating layer over said first layer, and a patterned photoresist layer over said bottom anti-reflective coating layer. The patterned photoresist layer will comprise a first pattern with a critical dimension $CD_{resist}$. A first wafer is selected from the plurality of wafers and the anti-reflective coating layer (or bottom anti-reflective coating layer) is etched to a first critical dimension $CD'_{pre}$. A slope S and an intercept I are determined from a $CD_{bias}$ versus bottom anti-reflective coating over-etch time graph, and a first over-etch time t* is determined from the $CD_{resist}$ of the first wafer ($CD'_{resist}$) using a relationship $t^*=(CD'_{resist}-CD_{target}-I)/S$, where $CD_{target}$ is the desired final (or designed) dimension of the transistor gate length. The bottom anti-reflective coating layer (or anti-reflective coating layer) of the first wafer is then etched from the first critical dimension $CD'_{pre}$ to a second critical dimension $CD'_{post}$ using the first over-etch time, t*, as the process time for the BARC over-etch step. The etched bottom anti-reflective coating layer is then used to pattern the first layer and the $CD'_{final}$ for the first wafer is measured. A second over-etch time $t_{lot}$ is determined from the $CD'_{final}$ value. Using the second over-etch time $t_{lot}$, a bottom anti-reflective coating over-etch time t(x) is determined for each of the plurality of wafers, wherein t(x) is a bottom anti-reflective coating over-etch time for a wafer x in said plurality of wafers. The subsequent wafers in the lot are then processed using the derived values of t(x) as the process time for the BARC over-etch step.

In a further embodiment of the instant invention, a normalized $CD_{bias}$ versus wafers etched relationship $CD^N_{bias}(x)$ is determined where $CD^N_{bias}(x)$ is the normalized value for the $x^{th}$ wafer etched in a sequence. Using this factor a bottom anti-reflective coating over-etch time t(x) is determined using a relationship $t(x)=[t_{lot}+(CD_{resist}(x)-CD'_{resist}-CD^N_{bias}(x)]/S$.

In yet a further embodiment of the instant invention, a method for determining a photoresist trim time to achieve a critical dimension $CD_{final}$ is described. The method comprises providing a plurality of semiconductor wafers where each of said plurality of wafers comprises: a first layer over a semiconductor, an anti-reflective coating layer over the first layer, and a patterned photoresist layer over the anti-reflective coating layer such that the patterned photoresist layer has a first pattern comprising a critical dimension $CD_{resist}$. A first wafer is selected from the plurality of semiconductor wafers and an initial photoresist trim time $t_{pt}*$ is determined from the $CD_{resist}$ of the first wafer using a relationship $t_{pt}*=(CD'_{resist}-CD_{target}-I)/S$, where $CD_{target}$ is the desired final (or designed) dimension of the transistor gate length, $CD'_{resist}$ is the $CD_{resist}$ of the first wafer, and S and I are, respectively, the slope and intercept determined from a $CD_{bias}$ versus photoresist trim time graph. The initial photoresist trim time is then used to etch (or trim) the patterned photoresist layer to a first critical dimension $CD''_{resist}$. The trimmed photoresist is then used to pattern the anti-reflective coating layer and the first layer, and the $CD'_{final}$ for the first wafer is measured. A second photoresist trim time $t_{ptlot}$ is determined from the $CD'_{final}$ value. Using the second photoresist trim time $t_{ptlot}$, a photoresist trim time $t_{pt}(x)$ is determined for each of said plurality of wafers, wherein $t_{pt}(x)$ is the photoresist trim time for a wafer x in said plurality of wafers. The subsequent wafers in the lot are then processed using the derived values of $t_{pt}(x)$ as the process time for the photoresist trim step.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIGS. 1 through 5 illustrate various aspects of the method for BARC over-etch time adjust with real-time process feedback. As described in greater detail below, the method of the instant invention can be used to determine the required BARC over-etch time to minimize the deviation in the critical dimension (CD), which in this case refers to the length of the transistor gate.

Figure 1A:
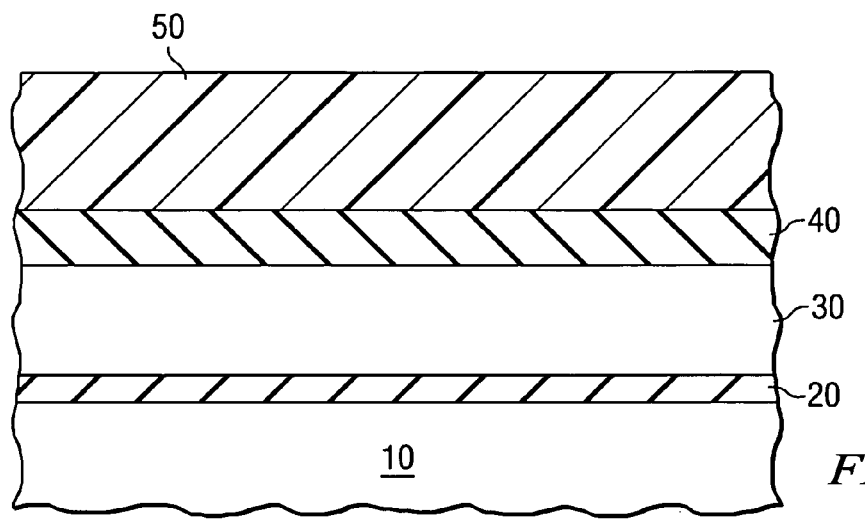
FIG. 1(a)-FIG. 1(e) are cross-sectional diagrams showing an embodiment of the BARC over-etch process.

FIG. 1(a)-FIG. 1(e) are cross-sectional diagrams showing an embodiment of the instant invention. The over-etch process will be illustrated using the formation of a MOS transistor gate structure. It is not intended however that the method of the instant invention be limited to this MOS transistor gate process. The method of the instant invention is applicable to the formation of any structure on an integrated circuit. As shown in FIG. 1(a), a dielectric layer 20 is formed on a semiconductor 10. The dielectric layer, in this embodiment, will function as the gate dielectric for a MOS transistor. A first layer 30 is formed on the dielectric layer 20 and will be used to form the gate of the MOS transistor. In this embodiment, the first layer 30 can comprise polycrystalline or amorphous silicon, although other conductive materials can be used. Following the formation of the first layer 30, a bottom anti-reflective coating (BARC) layer 40 is formed over the first layer. The BARC layer 40 will reduce the reflections of the incident radiation in the overlying photoresist during the exposure step of the photolithography process. It should be noted that the BARC layer of the instant invention is often referred to simply as an anti-reflective coating (ARC) layer and these descriptions are interchangeable. The BARC (or ARC) layer 40 can be formed using organic or inorganic material. Examples of inorganic material include silicon nitride and silicon carbide. Following the formation of the BARC layer 40, a layer of photoresist 50 is formed on the structure.

Figure 1B:
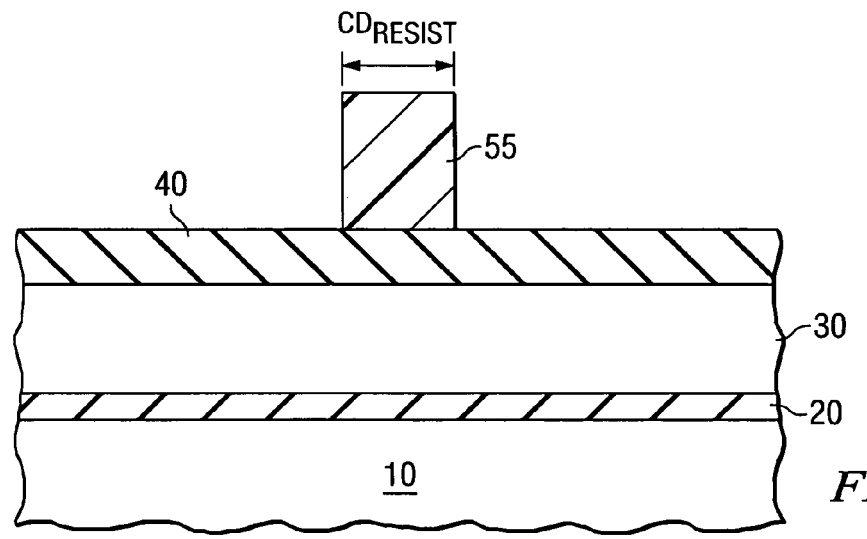
Figure 1C:
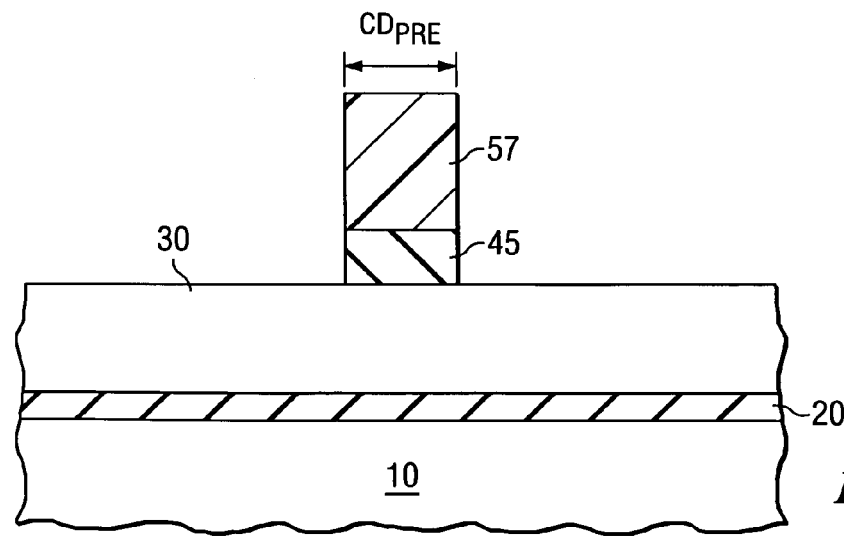
Figure 1D:
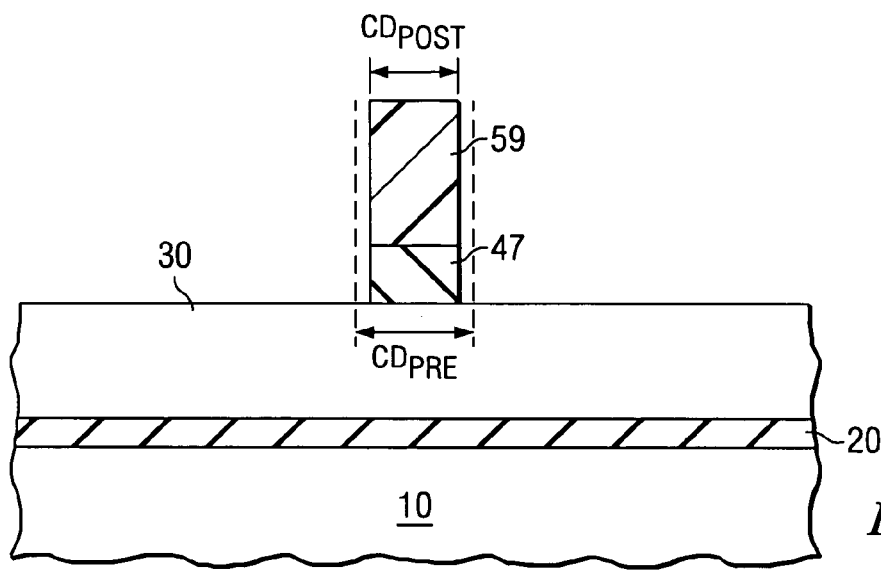
Figure 1E:
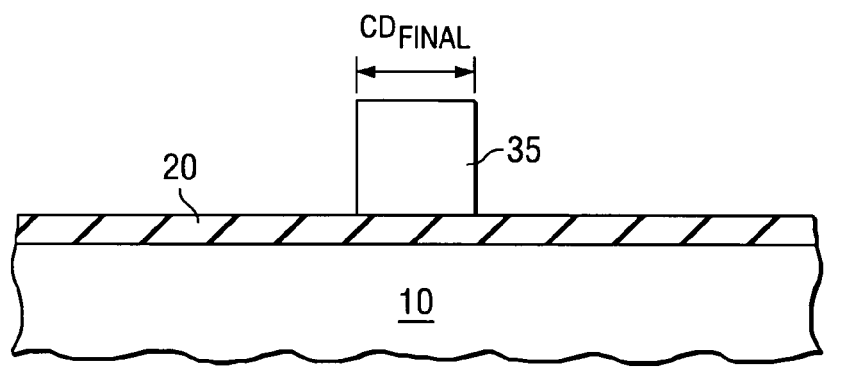

Using standard photolithographic processes, the photoresist layer 50 shown in FIG. 1(a) is patterned resulting in the patterned photoresist 55 shown in FIG. 1(b). The critical dimension (CD) $CD_{resist}$ of the photoresist 55 is shown in the Figure. Using the patterned photoresist 55 as an etch mask the underlying BARC layer 40 is etched using an initial BARC etching process. The initial BARC etching process is complete when all unmasked regions of BARC are removed from the wafer surface. At this point, the pattern of the photoresist has been transferred to the BARC layer. This is illustrated in FIG. 1(c), where the critical dimension $CD_{pre}$ of the BARC layer 45 is shown at the end of the initial BARC etching process. In general $CD_{pre}$ will be less than $CD_{resist}$ due to the narrowing of the patterned resist 55 during the initial BARC etching process. In processes such as the formation of the transistor gate structure in submicron MOS transistors, the initial dimension $CD_{resist}$ of the patterned photoresist and the dimension of the BARC at the end of the initial BARC etching process $CD_{pre}$ are typically larger than the final dimension of the gate structure. Therefore, following the initial etching of the BARC layer, a BARC over-etch (BOE) is performed to reduce the width of the BARC layer from $CD_{pre}$ to some value $CD_{post}$ that is less than $CD_{pre}$. This is illustrated in FIG. 1(d), where the width 47 of the BARC layer ($CD_{post}$) is less than $CD_{pre}$ and $CD_{resist}$. Following the formation of the BARC structure 47 with the desired width, the transistor gate 35 is etched using the BARC 47 as an etch mask. The BARC and resist or the BARC alone (if the resist is removed as part of the etch process) are then removed in a post-etch clean-up process. This final result of the process is illustrated in FIG. 1(e) where the transistor gate structure 35 is shown with a length of $CD_{final}$. Due to process variations, $CD_{final}$ will differ from the desired or designed gate critical dimension, $CD_{target}$. The difference between $CD_{resist}$ and $CD_{final}$ is a function of the length of time of the BARC over-etch (BOE) process. For a corresponding over-etch time, the reduction in the width CD of the transistor gate ($CD_{resist}$–$CD_{final}$) is often referred to as the $CD_{bias}$. It should be noted that, depending on the type of BARC and photoresist used, the underlying layer can be etched with or without the photoresist present. Therefore, in some cases it might be advantageous to remove the photoresist and use the remaining BARC layer as the etch mask. In other cases the photoresist will remain over the BARC layer and both the photoresist and the BARC structures will function as an etch mask. In either case, the CD of the formed structure will partly depend on the CD of the BARC layer. Additionally, the values of $CD_{resist}$ and $CD_{final}$ are typically determined from a metrology tool such as a scanning electon microscope (SEM) or scatterometer. In the case of a scatterometer, the values of $CD_{resist}$ and $CD_{final}$ are defined as a function of the primary physical parameters of the structure, such as CD at the bottom of the structure $CD_{bottom}$, sidewall angle of the structure SA, and resist or polysilicon height H. In a simple case, $CD_{resist}$ is defined as shown in equation (i)

$$CD_{resist} = CD_{bottom} - 2*H/\tan(SA) \tag{i}$$

More complicated functions to define $CD_{resist}$ or $CD_{final}$ are possible, and these variations are encompassed by the scope of the instant invention.

Figure 2:
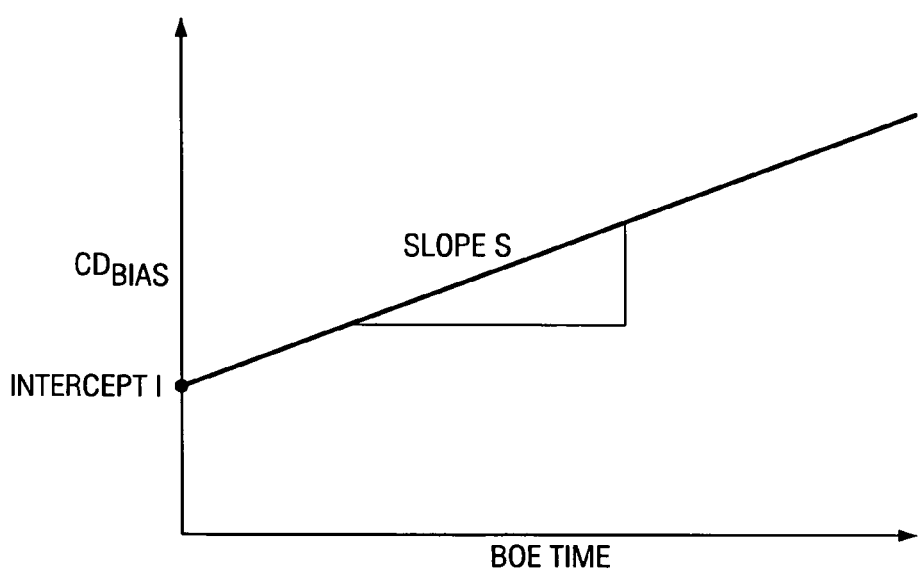
FIG. 2 shows a plot of CD bias versus BARC over-etch time for a given process.

Using the above described transistor gate formation process an embodiment of the instant invention will be described with reference to FIGS. 2 and 3. Shown in FIG. 2 is a plot of $CD_{bias}$ versus BARC over-etch (BOE) time for a given process. The plot is obtained by forming a structure and measuring the $CD_{bias}$ for different BOE times. The plot obtained is characterized by a slope S and an intercept I as shown in FIG. 2. For the transistor gate process described above, the plot shown in FIG. 2 is derived by: (1) measuring the value of $CD_{resist}$ on a set of wafers, (2) etching each wafer with a different BOE time, (3) measuring the different values of $CD_{final}$ on each wafer that correspond to different BOE times, (4) calculating the $CD_{bias}$ for each wafer and (5) plotting $CD_{bias}$ versus BOE time for each wafer. For step (2) above, it is not strictly necessary that each wafer be processed with a different BOE time or that the wafers be part of the same lot. All that is required is that the range of BOE times and corresponding $CD_{bias}$ values are large enough to accurately characterize the slope S and intercept I. Regarding FIG. 2 it should be noted that even if the points obtained from the measured values do not fall on a straight line, a slope and intercept can be obtained using a suitable method such as linear regression or any other method useful for obtaining a slope and intercept from a series of points plotted in Cartesian coordinates with a Y axis and a X axis. Here the Y axis represents $CD_{bias}$ and the X axis a corresponding etch time.

Integrated circuits are usually formed in batches of wafers called lots. A typical lot size comprises about 25 wafers. In forming the transistor gate structures, the photoresist and BARC layers used to pattern the gates will be formed on all the wafers of the lot in a mostly sequential manner. The photoresist layers will then be patterned to form structures with $CD_{resist}$ dimensions on all the wafers in the lot. It should be noted that the $CD_{resist}$ values so obtained will vary from wafer to wafer in a lot due to random and systematic variations in the processes.

Figure 3:
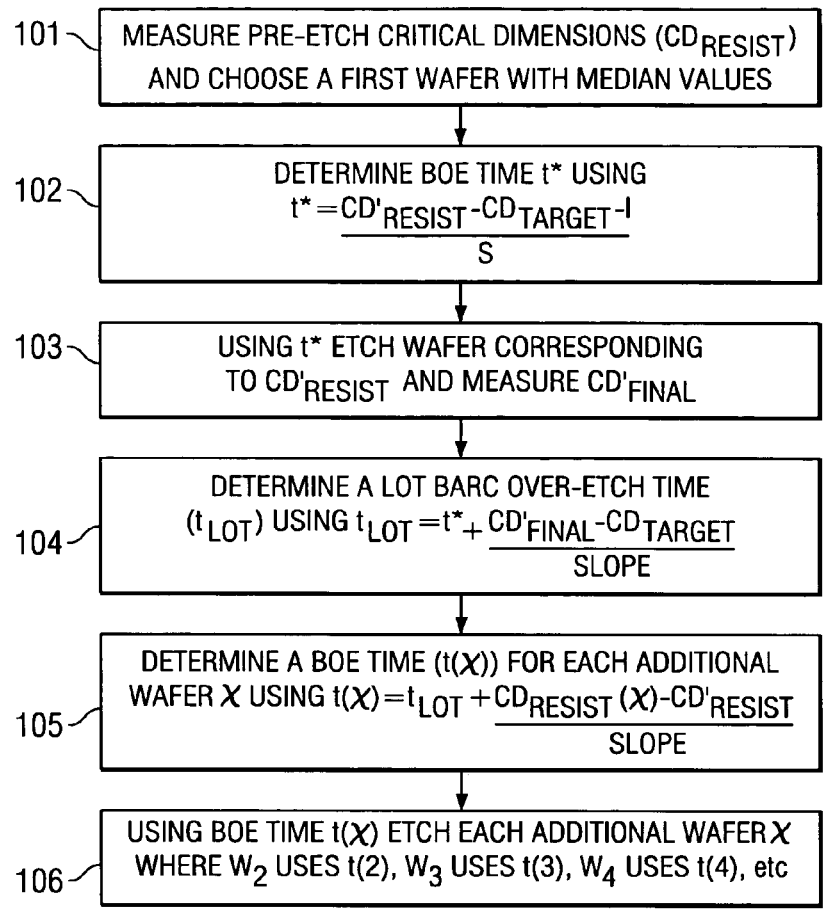
FIG. 3 is a flow diagram of an embodiment of the instant invention.

FIG. 3 illustrates the flow of the method of the instant invention. The first step 101 comprises measuring the $CD_{resist}$ values on all the wafers in a lot and choosing a first wafer with $CD_{resist}$ values close to the median of the measured values. In the case where the slope S of the $CD_{bias}$ versus BOE time plot is positive, the measured $CD_{resist}$ values should be greater than a minimum value $CD_{min}$, where $CD_{min}$ is equal to the target value for the width of the gate structure $CD_{target}$ plus an additional factor that depends on the intercept I and the minimum allowed BOE time. If $CD_{resist}$ is greater than $CD_{min}$ then the existing patterned photoresist structures are removed and replaced with patterned photoresist structures with a corrected $CD_{resist}$. Having chosen an initial wafer with a $CD_{resist}$ value close to the median $CD_{resist}$ value for all wafers in the lot, an initial BOE time t* is derived as shown in 102 of FIG. 3 using:

$$t^* = (CD'_{resist} - CD_{target} - I)/S \quad \text{(ii)}$$

where $CD'_{resist}$ is the value for the initial wafer, $CD_{target}$ is the post-etch target value for the transistor gate length, and I and S are the intercept and slope respectively taken from the corresponding $CD_{bias}$ versus BOE time plot. Using the BOE time t* found from equation (ii) as the process time for the BARC over-etch step, the initial wafer is etched and the $CD'_{final}$ value is obtained as shown in 103 of FIG. 3. Using the value of $CD'_{final}$ from the initial wafer, a "base" BARC over-etch time $t_{lot}$ is determined as shown in 104 of FIG. 3 using:

$$t_{lot} = t^* + (CD'_{final} - CD_{target})/S \quad \text{(iii)}$$

Using the value for $t_{lot}$ found from equation (iii), the BOE time t(x) for each subsequent wafer x is derived as shown in 105 of FIG. 3 using $$t(x) = t_{lot} + (CD_{resist}(x) - CD'_{resist})/S \quad \text{(iv)}$$

Here $CD_{resist}(x)$ is the value of $CD_{resist}$ obtained from wafer x, where x varies from 2 to n and n is the maximum number of wafers in the lot. The subsequent wafers in the lot are then processed using the derived values of t(x) as the process time for the BARC over-etch step. Therefore, the second wafer in the lot will have a BOE time of t(2), the third wafer in the lot will have a BOE time of t(3) and so on up to t(n) for the $n^{th}$ wafer in the lot as shown in 106 of FIG. 3. The BARC etch process can be summarized by:

$$\text{BARC etch process} = BARC_{initial} + BARC_{BOE}(t(x)) \quad \text{(v)}$$

where $BARC_{initial}$ is the initial BARC etch process and $BARC_{BOE}(t(x))$ is the variable-time BOE process. Adjusting the BOE time for each wafer using process feedback according to the method of the instant invention greatly reduces the variation in the resulting width of the gate structures from wafer to wafer within a lot.

Figure 4:
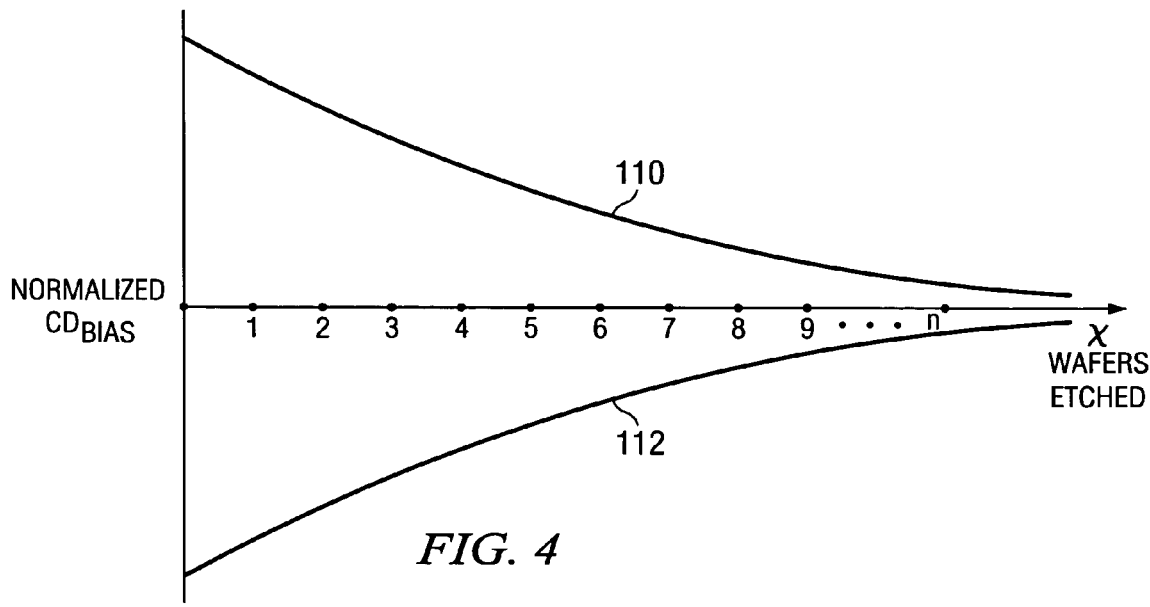
FIG. 4 is a normalized plot of $CD_{bias}$ versus number of wafers etched.

Given the sequential nature of the BARC etching process, a position dependent bias is sometimes introduced during the etch process that depends on the order in which the wafers are etched. An example of such an effect is illustrated in FIG. 4. As shown in the Figure the normalized $CD_{bias}$ of the various wafers can vary as a function of the order in which the wafers are etched. The curves 110 and 112 show two possible relationships. For embodiments where the $CD_{bias}$ is dependent on the order in which the wafers are etched the BOE time t(x) for each wafer is given by:

$$t(x) = t_{lot} + [CD_{resist}(x) - CD'_{resist} - CD^{N}_{bias}(x)]/S \quad \text{(vi)}$$

where $CD^{N}_{bias}(x)$ is the normalized value of CD bias for the wafer x taken from a curve similar to that shown in FIG. 4.

Figure 5A:
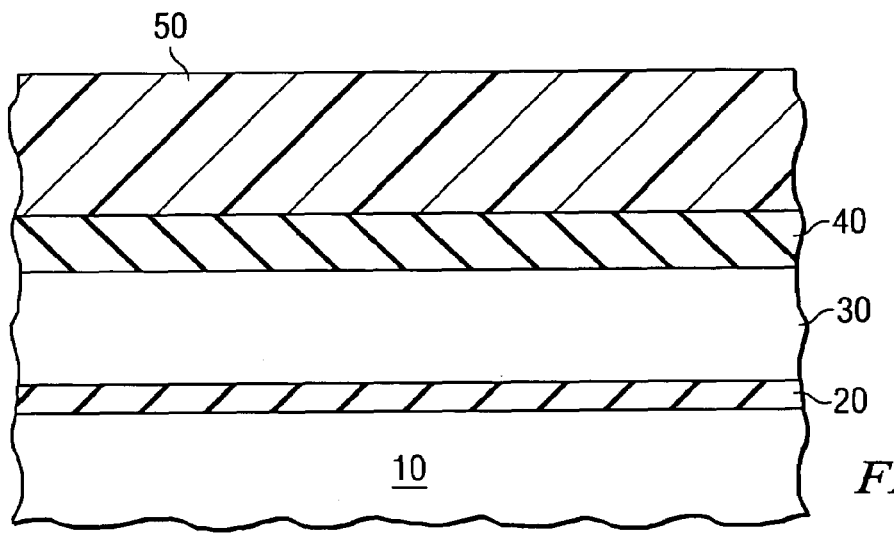
FIG. 5(a)-FIG. 5(d) are cross-sectional diagrams showing a further embodiment of the BARC over-etch process.
Figure 5B:
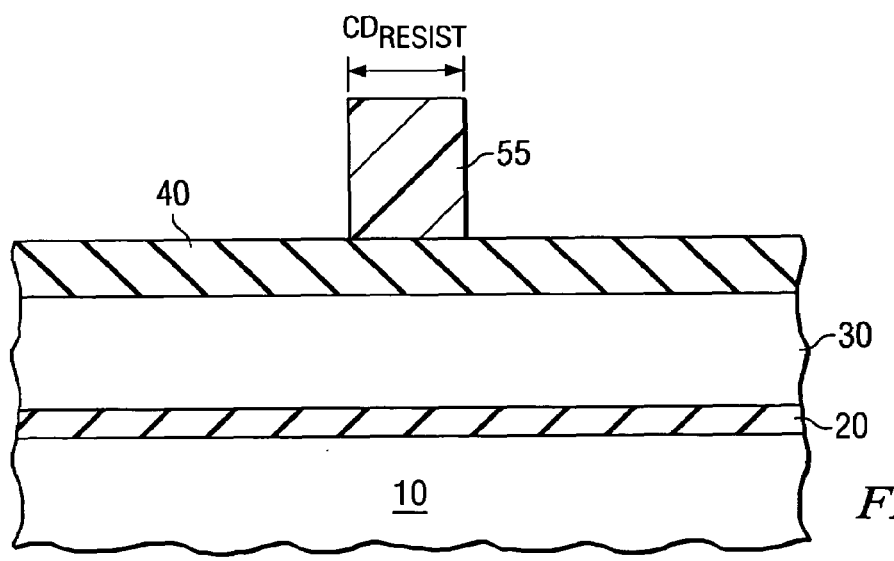
Figure 5C:
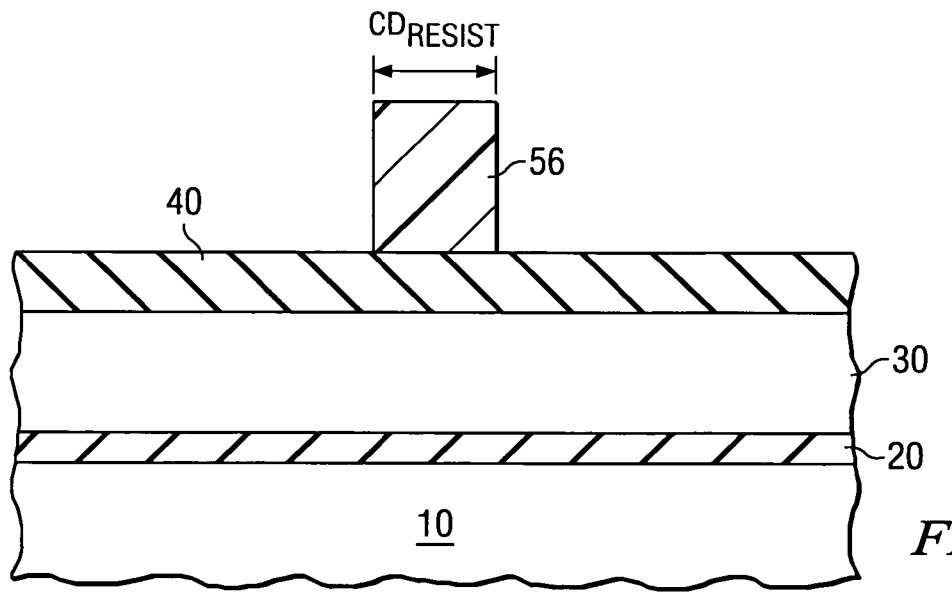
Figure 5D:
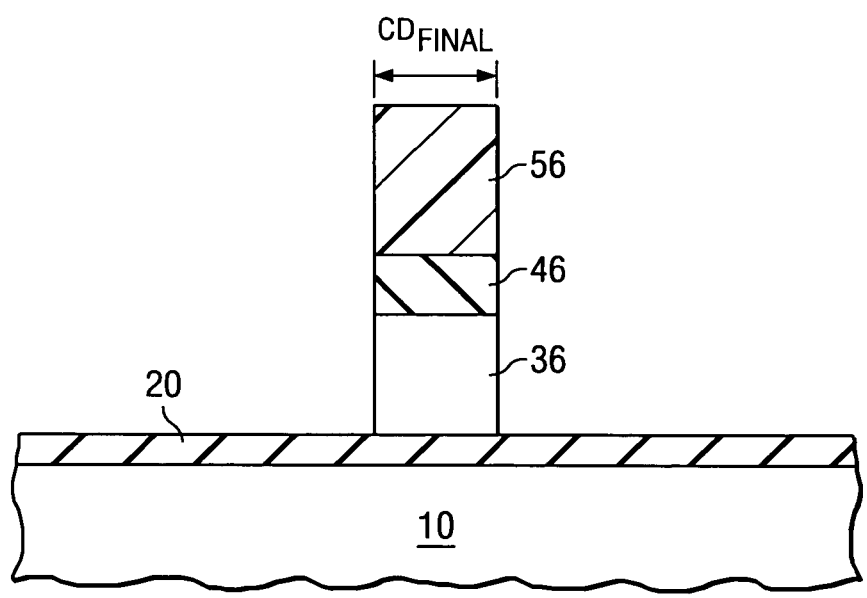

FIG. 5(a)-FIG. 5(d) are cross-sectional diagrams showing a further embodiment of the instant invention. As shown in FIG. 5(a), a dielectric layer 20, a first layer 30, a bottom anti-reflective coating (BARC) layer 40, and a layer of photoresist 50 are formed over a semiconductor 10. Using standard photolithographic processes, the photoresist layer 50 is patterned resulting in the patterned photoresist 55 shown in FIG. 5(b). The critical dimension (CD) $CD_{resist}$ of the photoresist 55 is shown in the Figure. Following the initial patterning of the photoresist layer 55, a photoresist trimming process is used to reduce the critical dimension of the photoresist as shown in FIG. 5(c) resulting in a new patterned photoresist structure 56 with a dimension $CD''_{resist}$ where $CD''_{resist}$ is less than $CD_{resist}$. Using the trimmed photoresist structure 56 as an etch mask, the underlying BARC layer 40 and the first layer 30 are etched as shown in FIG. 5(d). This process results in a transistor gate structure 36 with a length of $CD_{final}$. Due to process variations, $CD_{final}$ will differ from the desired or designed gate critical dimension, $CD_{target}$. The difference between $CD_{resist}$ and $CD_{final}$ is a function of the length of time of the photoresist trim process. The embodiment of the instant invention shown in FIG. 5(a) to FIG. 5(d) result in a measured $CD'_{resist}$ for an initial wafer and a measured $CD(x)_{resist}$ for each subsequent wafer in the lot. In addition a $CD'_{final}$ is obtained as shown in FIG. 5(d) for the initial wafer etched. Therefore using the equations and methodology described above, photoresist trim times for wafers 2 to n are given by $t_{pt}(x) = t_{ptlot} + (CD_{resist}(x) - CD'_{resist})/S$, where $t_{ptlot}$ is a "base" photoresist trim time and is given by $t_{ptlot} = t_{pt}^* + (CD'_{final} - CD_{target})/S$. Here $t_{pt}^*$ represents an initial photoresist trim time given by $t_{pt}^* = (CD'_{resist} - CD_{target} - I)/S$.

Although the present invention has been described with several embodiments, various changes and modifications may be suggested to one skilled in the art. For example the instant invention has been described using the transistor gate formation process as an example. It is not intended however that the scope of the instant invention be limited to this application. The method of the instant invention can be applied to any photolithographic process that uses a BARC layer and photoresist, or to photoresist alone to form integrated circuit structures or to etch processes in which changes to the resist or BARC etch time result in changes to the critical dimensions of underlying layers. It is therefore intended that the present invention encompass such changes and modifications that follow within the scope of the appended claims.

We claim:

1. A method for adjusting bottom anti-reflective coating over-etch time using real time process feedback to achieve a critical dimension $CD_{final}$, comprising:
   providing a plurality of semiconductor wafers with each of said plurality of wafers, comprising: a first layer over a semiconductor, a bottom anti-reflective coating layer over said first layer, a patterned photoresist layer over said bottom anti-reflective coating layer wherein said patterned photoresist layer has a first pattern comprising a critical dimension $CD_{resist}$;
   selecting a first wafer from said plurality of semiconductor wafers;
   etching said bottom anti-reflective coating layer of said first wafer to a first critical dimension $CD'_{pre}$;
   determining a first over-etch time t* from said $CD_{resist}$ of said first wafer;
   further etching said bottom anti-reflective coating layer of said first wafer from said first critical dimension $CD'_{pre}$ to a second critical dimension $CD'_{post}$ using said first over-etch time;
   using said further etched bottom anti-reflective coating layer, pattern said first layer and measure $CD'_{final}$ for said first wafer;
   determine a second over-etch time $t_{lot}$ from said $CD'_{final}$;
   etching said bottom anti-reflective coating layer of each of said remaining plurality of wafers to a first critical dimension $CD_{pre}(x)$, wherein $CD_{pre}(x)$ is a first critical dimension for a wafer x in said plurality of wafers;
   using said second over-etch time $t_{lot}$, determine a bottom anti-reflective coating over-etch time t(x) for each of said plurality of wafers, wherein t(x) is a bottom anti-reflective coating over-etch time for a wafer x in said plurality of wafers;
   determining a slope S and an intercept I from a $CD_{bias}$ versus bottom anti-reflective coating over-etch time graph; and
   wherein said first over-etch time t* is determined using a relationship $t^* = (CD'_{resist} - CD_{target} - I)/S$.

2. The method of claim 1 wherein said second over-etch time $t_{lot}$ is determined using a relationship $t_{lot} = t^* + (CD'_{final} - CD_{target})/S$.

3. The method of claim 1 wherein the bottom anti-reflective coating over-etch time t(x) is determined using a relationship $t(x) = t_{lot} + (CD_{resist}(x) - CD'_{resist})/S$.

4. A method for adjusting bottom anti-reflective coating over-etch time using real time process feedback and normalization to achieve a critical dimension $CD_{final}$, comprising:
   providing a plurality of semiconductor wafers with each of said plurality of wafers, comprising: a first layer over a semiconductor, a bottom anti-reflective coating layer over said first layer, a patterned photoresist layer over said bottom anti-reflective coating layer wherein said patterned photoresist layer has a first pattern comprising a critical dimension $CD_{resist}$;
   selecting a first wafer from said plurality of semiconductor wafers;
   etching said bottom anti-reflective coating layer of said first wafer to a first critical dimension $CD'_{pre}$;
   determining a slope S and an intercept I from a $CD_{bias}$ versus bottom anti-reflective coating over-etch time graph.
   determining a first over-etch time t* from said $CD_{resist}$ of said first wafer using a relationship $t^* = (CD'_{resist} - CD_{target} - I)/S$;
   further etching said bottom anti-reflective coating layer of said first wafer from said first critical dimension $CD'_{pre}$ to a second critical dimension $CD'_{post}$ using said first over-etch time;
   using said further etched bottom anti-reflective coating layer, pattern said first layer and measure $CD'_{final}$ for said first wafer;
   determine a second over-etch time $t_{lot}$ from said $CD'_{final}$;
   etching said bottom anti-reflective coating layer of each of said remaining plurality of wafers to a first critical dimension $CD_{pre}(x)$, wherein $CD_{pre}(x)$ is a first critical dimension for a wafer x in said plurality of wafers; and
   using said second over-etch time $t_{lot}$, determine a bottom anti-reflective coating over-etch time t(x) for each of said plurality of wafers, wherein t(x) is a bottom anti-reflective coating over-etch time for a wafer x in said plurality of wafers.

5. The method of claim 4 wherein said second over-etch time $t_{lot}$ is determined using a relationship $t_{lot} = t^* + (CD'_{final} - CD_{target})/S$.

6. The method of claim 4 wherein the bottom anti-reflective coating over-etch time t(x) is determined using a relationship $t(x) = t_{lot} + (CD_{resist}(x) - CD'_{resist})/S$.

7. The method of claim 4 further comprising determining a normalized $CD_{bias}$ versus wafers etched relationship $CD^N_{bias}(x)$, wherein $CD^N_{bias}(x)$ is the normalized value for the $x^{th}$ wafer etched in a sequence.

8. The method of claim 7 wherein the bottom anti-reflective coating over-etch time t(x) is determined using a relationship $t(x) = t_{lot} + [CD_{resist}(x) - CD'_{resist} - CD^N_{bias}(x)]/S$.

9. A method for determining photoresist trim time to achieve a critical dimension $CD_{final}$, comprising:
   providing a plurality of semiconductor wafers with each of said plurality of wafers, comprising: a first layer over a semiconductor, an anti-reflective coating layer over said first layer, a patterned photoresist layer over said anti-reflective coating layer wherein said patterned photoresist layer has a first pattern comprising a critical dimension $CD_{resist}$;
   selecting a first wafer from said plurality of semiconductor wafers;
   determining an initial photoresist trim time $t_{pt}^*$;
   trim said patterned photoresist layer using said initial trim time;
   using said trimmed photoresist layer, pattern said first layer and measure $CD'_{final}$ for said first wafer;
   determine a second trim time $t_{ptlot}$;
   using said second trim time $t_{ptlot}$, determine a trim time $t_{pt}(x)$ for each of said plurality of wafers, wherein $t_{pt}(x)$ is a patterned photoresist trim time for a wafer x in said plurality of wafers;
   determining a slope S and an intercept I from a $CD_{bias}$ versus over-etch time graph;
   determining said initial trim time $t_{pt}^*$ using a relationship $t_{pt}^* = (CD'_{resist} - CD_{target} - I)/S$; and
   determining said second photoresist trim time $t_{ptlot}$ using a relationship $t_{ptlot} = t_{pt}^* + (CD'_{final} - CD_{target})/S$.

* * * * *